United States Patent [19]
Lemke

[11] Patent Number: 5,745,349
[45] Date of Patent: Apr. 28, 1998

[54] SHIELDED CIRCUIT BOARD CONNECTOR MODULE

[75] Inventor: Timothy Lemke, Carlisle, Pa.

[73] Assignee: Berg Technology, Inc., Reno, Nev.

[21] Appl. No.: 782,715

[22] Filed: Jan. 13, 1997

Related U.S. Application Data

[63] Continuation of Ser. No. 583,489, Jan. 5, 1996, abandoned, which is a continuation of Ser. No. 196,516, Feb. 15, 1994, abandoned.

[51] Int. Cl.$^6$ .............................. H05K 9/00; H05K 7/20
[52] U.S. Cl. .................... 361/818; 361/754; 361/759; 361/720; 29/829; 174/35 R
[58] Field of Search .................... 439/607–610; 174/35 R, 35 MS, 260; 361/752–754, 759–760, 785, 791, 800, 816–818, 718–721; 29/829, 831, 832

[56] References Cited

U.S. PATENT DOCUMENTS

| | | | |
|---|---|---|---|
| 4,169,642 | 10/1979 | Mouissie . | |
| 4,628,412 | 12/1986 | Nigorikawa | 361/424 |
| 4,697,044 | 9/1987 | Ishikawa | 174/35 R |
| 4,932,904 | 6/1990 | Ichitsubo | 439/630 |
| 5,005,106 | 4/1991 | Kiku . | |
| 5,014,160 | 5/1991 | McCoy, Jr. . | |
| 5,031,076 | 7/1991 | Kiku . | |
| 5,038,250 | 8/1991 | Uenaka et al. . | |
| 5,099,396 | 3/1992 | Barz et al. | 174/35 R |
| 5,104,327 | 4/1992 | Walburn | 439/71 |
| 5,111,362 | 5/1992 | Flamm et al. . | |
| 5,160,807 | 11/1992 | Fry et al. | 361/818 |
| 5,176,526 | 1/1993 | Hillbish et al. | 439/108 |
| 5,207,586 | 5/1993 | MacGregor et al. | 439/76 |
| 5,242,310 | 9/1993 | Leung | 439/76 |

FOREIGN PATENT DOCUMENTS

| | | |
|---|---|---|
| 0 484 853 A1 | 5/1992 | European Pat. Off. . |
| 2749848 A1 | 6/1978 | Germany . |
| 4037763 A1 | 6/1992 | Germany . |
| 0264498 | 10/1990 | Japan ............ 174/35 R |

OTHER PUBLICATIONS

Terry Cowslow; *Competitive Solution;* "Liquid Cooling Flows to Desktop PCs" (no date and other information provided).
ECN; Featured Product: "PGA Socket Cuts Insertion Forces by Up to Two–Thirds", 1993.
Technical Bulletin 50: "Cho–Therm Cool Clad Insulated Metal Substrate", (no date provided).
Product Information: "New Scotch Brand Thermally Conductive Adhesive Transfer Tapes" (no date provided) no other information.
Chomerics, Inc.: Thermal Gap Filling Materials, 1992.
les Nouvelles; Dec. 1993; Patent & Technology Licensing Committee; "Survey on Patentability of Living Material".
ECN; 273–Pos. AIF–LIF PGA Sockets Product Literature (no date provided).
Berg Electronics Product Literature; Memory Card Systems (no date provided).

*Primary Examiner*—Bot L. Ledynh
*Attorney, Agent, or Firm*—Woodcock Washburn Kurtz Mackiewicz & Norris LLP

[57] ABSTRACT

The present invention provides a shielded circuit board module comprising a conductive frame and conductive cover for substantially shielding an entire circuit board. Apertures are provided in the frame so that connectors on the circuit board are exposed through these apertures rather than shielded by the conductive frame. The assembled conductive frame, cover and circuit board form a shielded circuit board connector module. According to the invention the shielded circuit board connector module can be mated with another circuit board in a parallel configuration. A receptacle frame is preferably mounted on the other circuit board to permit the module to be easily inserted therein so that the circuit boards can be connected. The receptacle frame provides for easy extraction of the module from its connection with another circuit board. In particular an eject handle and cam bars are coupled to the receptacle frame according to the invention to assist in extracting the module from its connection with another circuit board. A method of connecting the conductive frame and cover to the circuit board to assemble the shielded circuit board connector module is also provided.

14 Claims, 9 Drawing Sheets

SHIELDED CIRCUIT BOARD CONNECTOR MODULE

This is a continuation of application Ser. No. 08/583,489, filed Jan. 5, 1996, now abandoned, which is a continuation of application Ser. No. 08/196,516, filed Feb. 15, 1994, now abandoned.

FIELD OF THE INVENTION

The present invention relates to shielded modules for connecting printed circuit boards together. More particularly, the invention relates to a method and module for shielding expansion boards in data processing systems.

BACKGROUND

Figure 1:
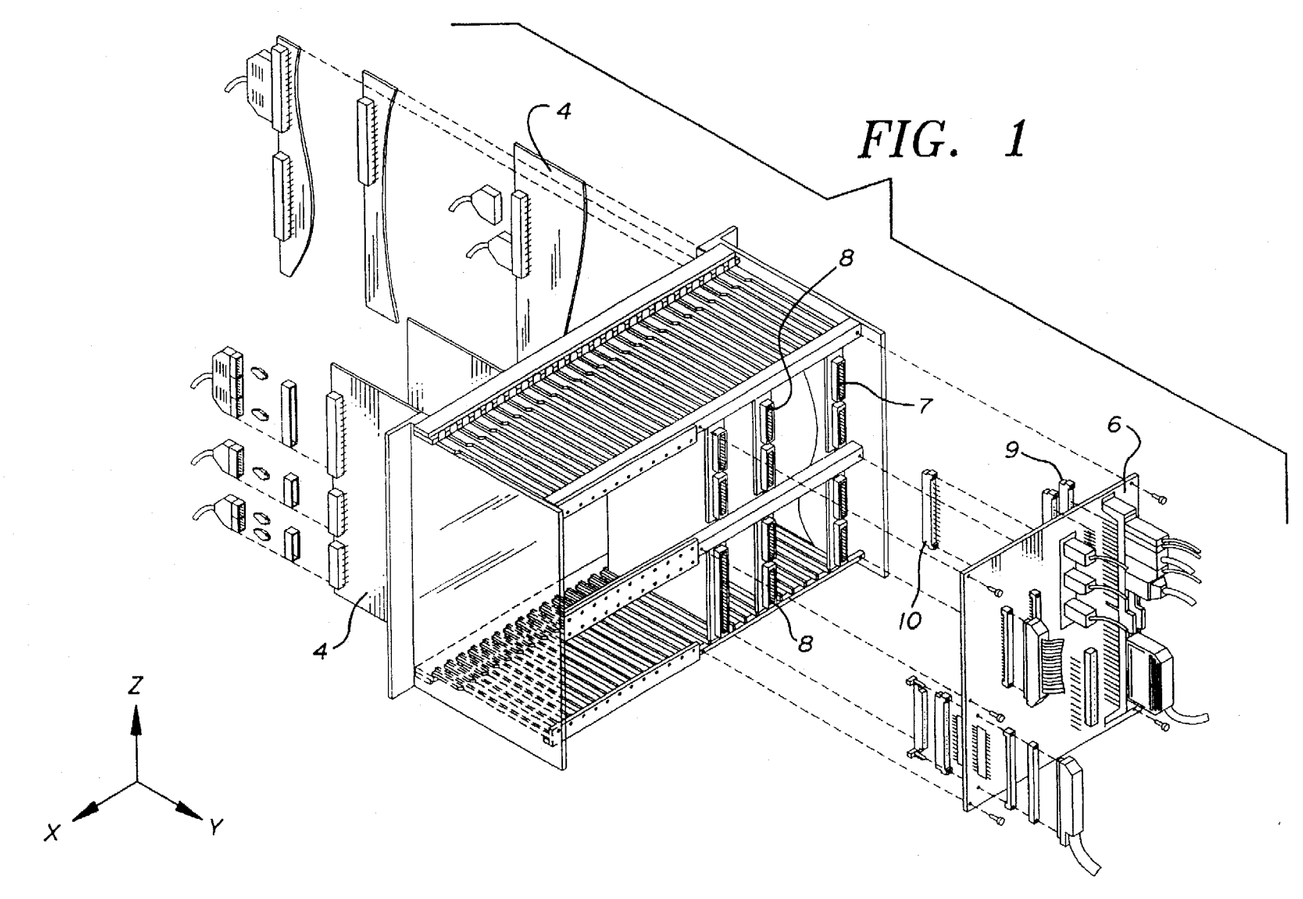
FIG. 1 shows an exploded view of a perpendicular type connection between a mother board and an expansion board.

Most computer processing is performed by electronics provided on printed circuit boards (PCB) which are mounted on the inside of a chassis. In particular, substantially all personal computers provide a main PCB containing the electronics (e.g., integrated circuits (ICs)) used to carry out the computer's general processing functions. This PCB is often referred to as the "mother board." When upgraded electronics for data processing becomes available for a particular data processing system or if additional memory or processing is desired, an expansion board often referred to as a "daughter board" may be connected to the mother board. As shown in FIG. 1, it is common to provide a mother board 6 which serves as a backplane for mounting additional boards so that the additional boards are electrically interconnected to the mother board. Typically, right angle connectors 7 and 8 have been used to interconnect the expansion boards 4 orthogonally to the mother board 6 via connectors 9 and 10, respectively, as shown by the dash-and-dot lines in FIG. 1.

With respect to the Cartesian coordinate system x, y, z shown in FIG. 1, the expansion boards 4 are positioned with their plane parallel to the y-z plane and are offset mutually in the x direction. The mother board 6 is arranged in parallel to the x-z plane.

For years, the electronics industry, driven in particular by the data processing market, has strived to reduce the size, cost and complexity of data processing components. To reduce the overall size of the chassis housing the PCBs in a data processing system it is desirable to stack the PCBs in parallel rather than in the orthogonal arrangement shown in FIG. 1. Connection assemblies for interconnecting PCBs in a stacked configuration are disclosed in U.S. Pat. No. 5,176,526, Jan. 5, 1993, issued to Hillbish et al. and entitled, "Shielded Stacking Electrical Connector Assembly."

Typically, some of the electrical components on the PCBs are shielded to reduce electromagnetic interference (EMI) caused by other electrical components. For instance, U.S. Pat. No. 5,014,160, May 7, 1991, issued to McCoy and entitled, "EMI/RFI Shielding Method and Apparatus," discloses an apparatus for shielding only selected portions of a printed circuit board. However, it has not been practical or feasible to shield the entire PCB. Therefore, the chassis housing the mother board and expansion boards has provided some shielding on its inner surface to prevent effects from externally generated EMI. Unfortunately, the chassis and partial PCB shielding cannot reduce the EMI effects on a board-by-board basis without shielding each PCB separately.

The high-speed electronics typically associated with expansion boards generate substantial thermal energy. Excess heat, however, may damage the electronic components and generally cause the data processing system to fail. For this reason, chassis are often enlarged to allow thermal energy to dissipate or to permit installation of an internal fan to cool the electronics. In applications where it is desired to shield the electronics on an individual PCB, it is often necessary to design a cooling system for the PCB. The stacked PCB configuration described above increases the necessity for cooling since the thermal energy generated may be confined between adjacent PCBs.

One solution to the cooling problem has been to design metal heat sinks into the shielding and use a fan to assist in dissipating thermal energy away from the electronics through the heat sinks into the chassis. However, metal heat sinks are relatively heavy and expensive. Moreover, since an internal fan is required, the size of the chassis cannot be reduced.

Another solution introduced by Aavid Engineering, Inc. is to provide a liquid coolant such as Fluronert into a plastic case disposed on top of the ICs. According to this technique, the liquid coolant is heated to boiling by the thermal energy generated by the ICs. A series of tubes leading away from the ICs extend from the plastic case so that the heated coolant in a gaseous state can dissipate and cool. Once cooled, the coolant returns to its liquid state and is recycled back to the plastic case through another series of tubes thereby maintaining the chip at an acceptable temperature. The advantage of this technique is that a fan is not required and, thus, the chassis size may be reduced. However, there are several disadvantages of this technique. For instance, this technique requires custom design for each IC which may also depend upon the configuration of the PCBs inside any given chassis. Thus, its implementation and design are complicated, and its costs, like metal heat sinks, are relatively high.

Pin Gate Array (PGA) connectors are commonly used to connect the expansion boards perpendicularly to the mother board via a zero-insertion-force connectors known as a "ZIFs" or low-insertion-force connectors referred to as "LIFs". However, there are a number of drawbacks associated with interconnecting the expansion boards using PGAs. For instance, the perpendicular orientation shown in FIG. 1 requires the use of an enlarged chassis. Moreover, ZIFs and LIFs are somewhat complicated and relatively expensive. Insertion of an expansion board using PGAs is often difficult because the mother board sockets may not be easily accessible and the pin connectors on the PCB expansion board have no lead-in guidance. Thus, inserting the expansion board using PGAs may require trial and error before the connectors are properly mated. Still further, the PGAs provide substantially no protection for the connector pins. Therefore, the pins may be easily damaged or broken prior to insertion thereby necessitating replacement of the entire expansion board including the electronics.

There is a need for a shielded circuit board connector module and a technique for shielding individual PCBs to be interconnected to a mother board in a stacked configuration. Such shielded modules should provide for adequate heat dissipation and easy insertion and extraction. However, the connector module should allow for a reduction in the size of the chassis as compared to current designs in which an internal chassis fan must be provided. Moreover, the connector module should be simple in design to minimize cost and the complexity of implementation.

SUMMARY OF THE INVENTION

The present invention fulfills these needs by providing a shielded module for a circuit board. The shielded module according to the present invention comprises a conductive frame capable of being mechanically coupled to the front surface of the circuit board to substantially enclose electronics between the conductive frame and the circuit board; and a conductive cover capable of being mechanically coupled to the rear surface of the circuit board to substantially cover the rear surface. The conductive frame according to the invention has one corresponding aperture for each connector extending from the front surface of the circuit board so that the connectors are not enclosed by the conductive frame. The apertures preferably have a depth sufficient to insertably guide respective connectors to mate with a corresponding mating connector on another circuit board. In a preferred embodiment, the conductive frame provides an indication of the polarity of the electronics when the circuit board is mechanically coupled to the conductive frame. In a more preferred embodiment, a thermal transfer medium is disposed between the conductive frame and the electronics for coupling thermal energy generated by the electronics to the conductive frame. When the shielded module is assembled with a printed circuit board, the combination is referred to as a connector module. The connector module according to the present invention is capable of being connected to another circuit board having at least one surface so that the surfaces of the circuit boards are parallel. In a preferred embodiment, a camming means is operatively interfaced with the conductive frame to cam the connector module from its connection with the other circuit board.

A shielded circuit board connector module is also provided in accordance with the present invention to fulfill the aforementioned needs. The circuit board connector module comprises a circuit board; a conductive frame mechanically coupled to the circuit board so that the frame substantially shields the front surface of the circuit board while exposing each connector extending from the surface of the circuit board; and a conductive cover mechanically attached to a rear surface of the circuit board to substantially shield the entire rear surface of the circuit board. A receptacle frame mounted to a mother board is also preferably provided so that the connector module is connected with the mother board by inserting the connector module into the receptacle frame. In a more preferable embodiment, a camming means is attached to the receptacle frame to cam the connector module from its connection with the other circuit board.

A method of assembling a shielded circuit board connector module is also provided by the present invention. This method comprises attaching a conductive frame to the front surface of a circuit board; and attaching a conductive cover to the rear surface of the circuit board to substantially shield the rear surface. According to a the invention, the circuit board is preferably connected to a second circuit board having one or more mating connectors capable of mating with connectors extending from the front surface of the circuit board. Preferably, the method according to the invention further comprises the steps of attaching a receptacle frame to a mother board, and connecting the connector module to the mother board by inserting the connector module into the receptacle frame. In a more preferred embodiment, a camming means is operatively interfaced with the receptacle frame and the conductive frame to operatively lock-in the connection between the circuit boards and to extract the connector module from the mother board.

BRIEF DESCRIPTION OF THE DRAWINGS

The present invention will be better understood and its numerous objects and advantages will become apparent by reference to the following detailed description of the invention when taken in conjunction with the following drawings, in which.

DETAILED DESCRIPTION OF THE INVENTION

Figure 2:
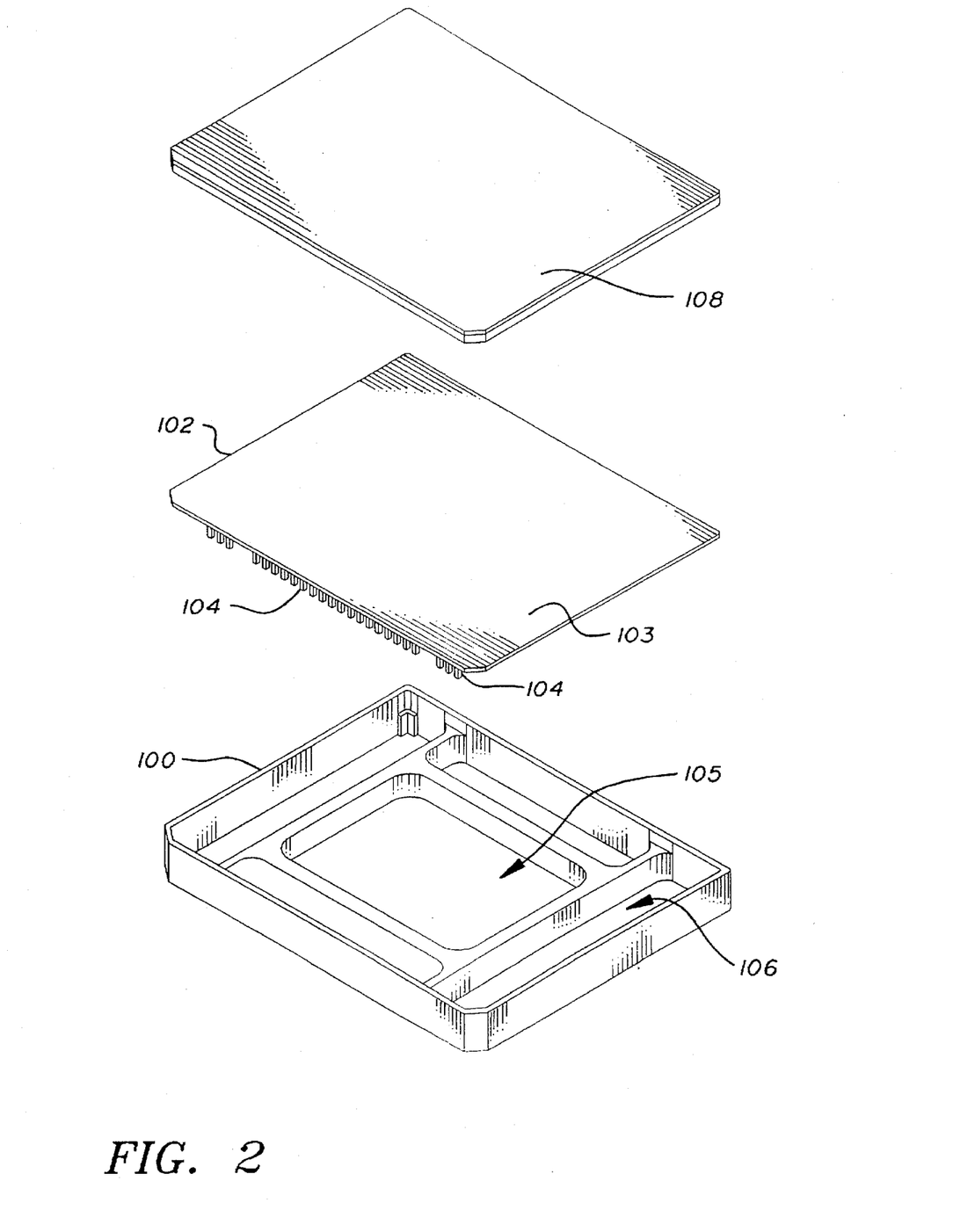
FIG. 2 shows a cover, a circuit board and a frame according to the present invention.

Like reference numerals refer to like elements in the figures. FIG. 2 shows some of the primary elements of the shielded module according to the present invention. The rear surface 103 of a printed circuit board 102 having one or more expansion chips or ICs (not shown) is depicted. One or more connectors 104 extend from the front planar surface of the PCB 102. An electrically and thermally conductive frame 100 is formed so that the PCB 102 may be riveted to the inside portion 105 of the conductive frame 100. Metallic materials such as zinc, magnesium, or aluminum die cast metals may be used for the conductive frame 100. Apertures 106 are formed in the conductive frame 100 so that when the conductive frame 100 is riveted to the PCB 102, the connectors 104 may extend through the apertures 106. It should be understood that the size and number of apertures may vary depending upon the type and number of connectors 104 extending from the PCB 102. The module structure is preferably completed by a conductive cover 108 which may be mechanically coupled to the rear planar surface 103 of the PCB 102 or the conductive frame 100. The conductive cover 108 is also preferably made of a metallic material such as stainless steel.

Figure 3:
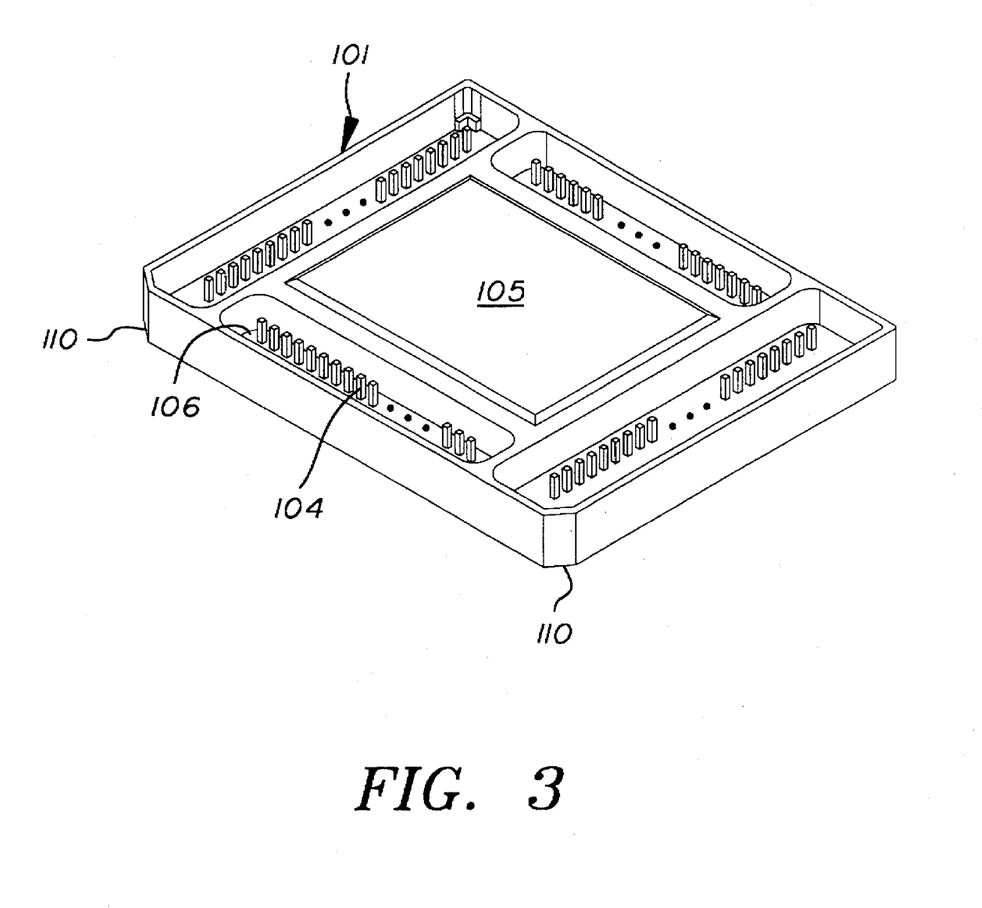
FIG. 3 shows a front surface view of an assembled shielded circuit board connector module according the present invention.

The assembly of the conductive frame 100 (hereinafter "module frame"), PCB 102, and cover 108 components as described above results in a shielded circuit board connector module (hereinafter referred to as the "connector module"). FIG. 3 depicts a front surface view of a connector module having four connectors 104. In the example depicted in FIG. 4, two 51-pin miniature connectors and two 81-pin miniature connectors are shown to extend through the apertures 106 to provide a total of 264 pin positions. However, it should be understood that the present invention is not to be limited to the number or type of connectors shown in the figure.

In a preferred embodiment, the walls of the apertures 106 have a height approximately equal to the length of the pins to protect the pins from damage. For instance, if the pins of the connectors 104 are damaged when a PCB is inadvertently dropped or crushed the entire PCB would require replacement even though the PCB's electronics was not similarly damaged. By enclosing the connectors within the frame aperture of equal height, damage to the pins can be avoided if the connector module is dropped or subjected to other destructive forces.

In another preferred embodiment, the size of the apertures 106 are designed to substantially fit the intended mating connector, i.e, socket, to allow for easy insertion of the mating connector. In this way, one connecting the expansion board to a mother board would merely have to align the aperture with the mating socket. If the aperture is too large or if no shielding is provided, one connecting the expansion board to a mother board must attempt to align the individual rows and columns of pins of each connector with the individual rows and columns of the mating socket. As described above, such alignment often requires numerous trials before the boards are successfully interconnected.

In a further preferred embodiment, the module frame 100 is configured to identify the polarity of the electronics housed by the connector module. For example, two of the corners 110 of the frame 100 are clipped as shown in FIG. 3 to indicate the polarity of the connector module shown in that figure.

Figure 4:
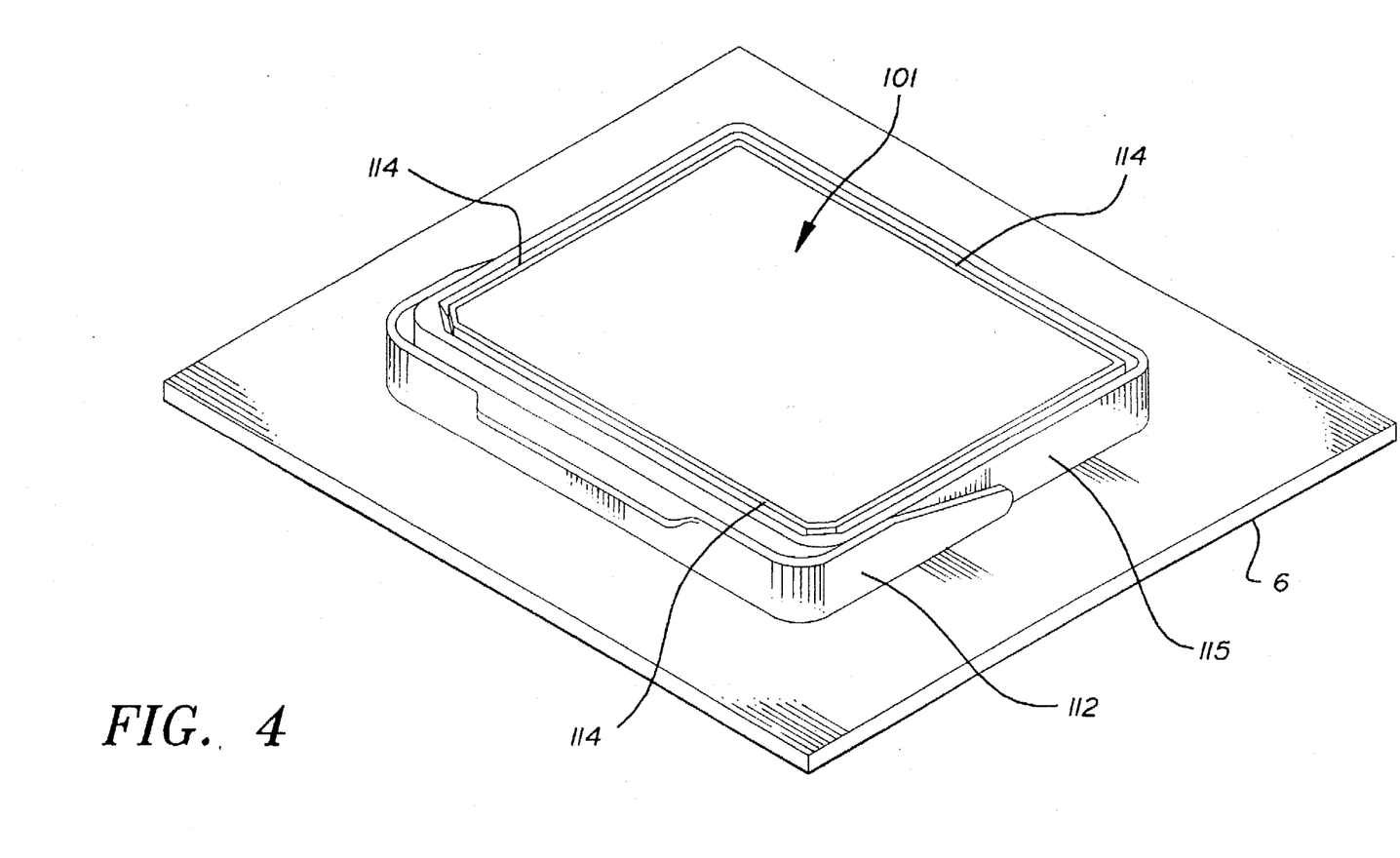
FIG. 4 shows a printed circuit board module mated with a mother board having a receptacle frame and eject handle according to a preferred embodiment of the present invention.

In a preferred embodiment, a receptacle frame is mounted to a mother board to further improve the lead-in guidance of the connector module. FIG. 4 depicts the connector module 101 connected to a mother board 6 having a receptacle frame 115 mounted on its surface. As shown in the figure, the connector module 101 is inserted into the receptacle frame 115 to mate with connectors on the mother board 6. Details of the receptacle frame 115 are provided below.

In a further preferred embodiment, the connector module 101 may be secured to the mother board 6 as shown in FIG. 4. In the preferred embodiment shown in FIG. 4 an eject handle 112 is attached to the receptacle frame 115. It should be understood that the eject handle 112 may be associated directly with the connector module 101 by a connection with two edges 114 of the module frame 100.

Figure 5A:
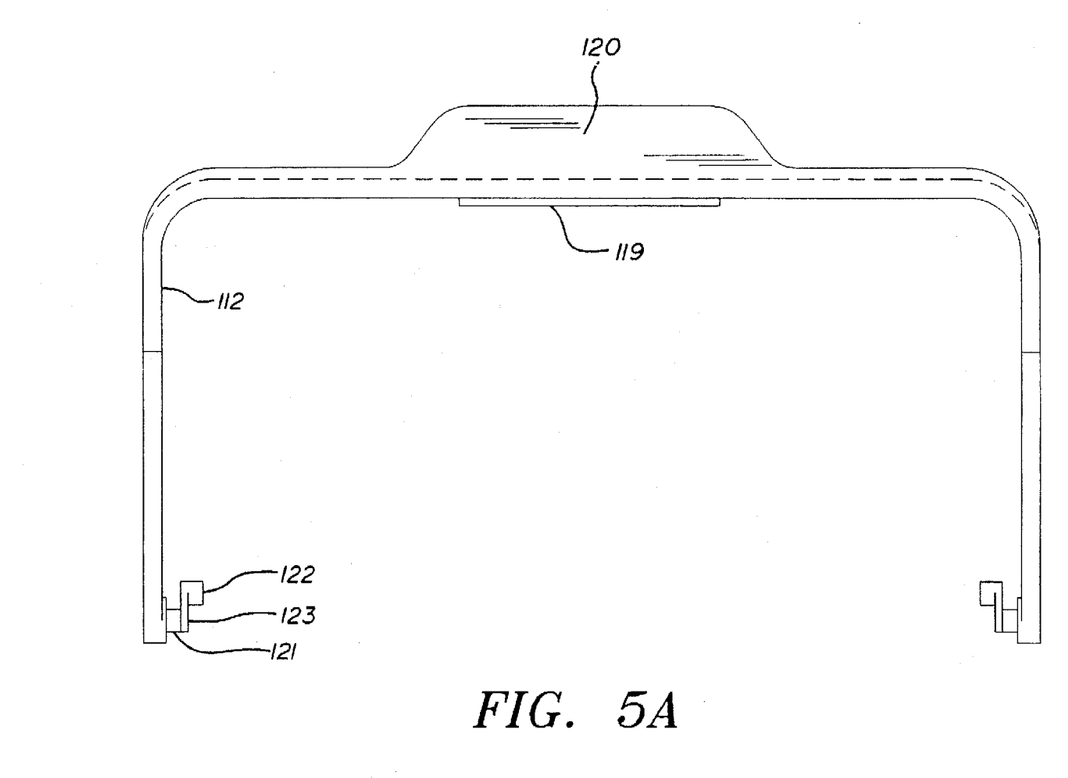
FIG. 5A shows a top view of the eject handle according to a preferred embodiment of the present invention.
Figure 5B:
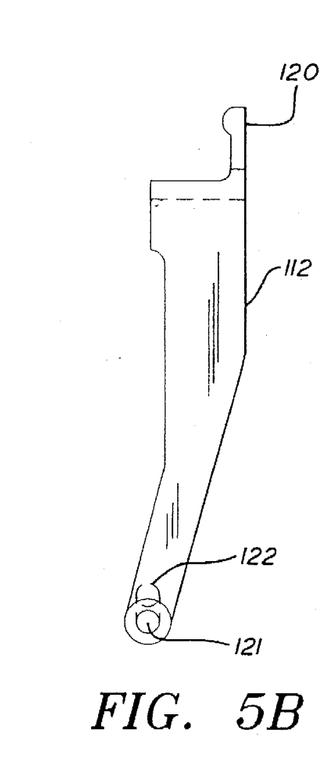
FIG. 5B shows a side view of the eject handle according to a preferred embodiment of the present invention.

A top view of the eject handle 112 is shown in FIG. 5A. As shown, a handle projection 120 protrudes from the eject handle 112. Two driving rods 121 and 122 are attached at the base of the eject handle 112. The driving rods 121 and 122 are mechanically linked together via plate 123 which projects from an end of driving rod 122 and is coupled to an end of driving rod 121. In a preferred embodiment, driving rods 121 and 122 are directionally aligned in parallel with a displacement between their respective center axis. A side view of the eject handle 112 is shown in FIG. 5B.

Figure 6A:
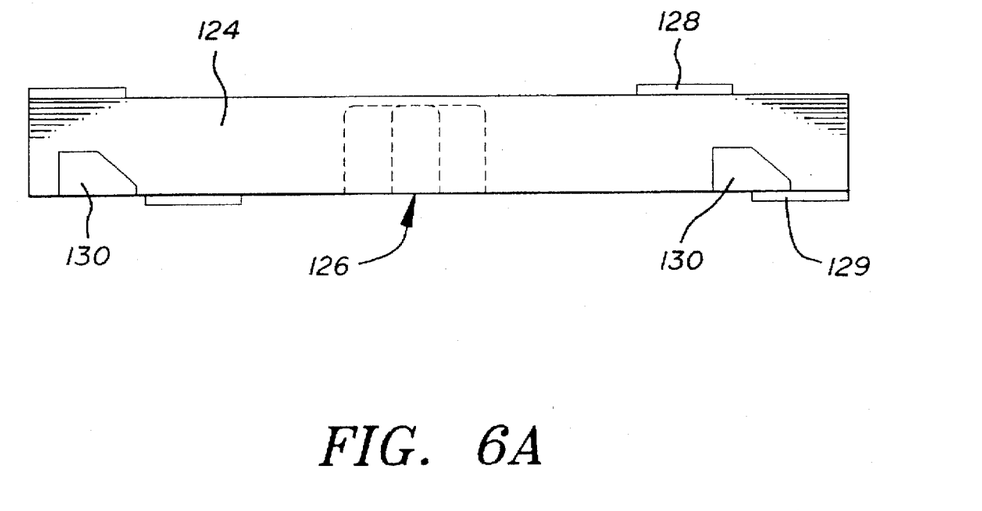
FIG. 6A shows a side cross sectional view of a cam bar according to a preferred embodiment of the present invention.
Figure 6B:
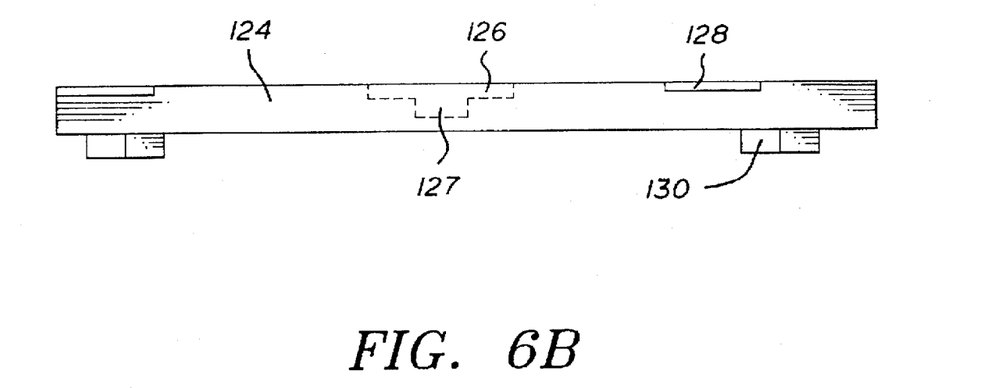
FIG. 6B shows a top cross sectional view of a cam bar according to a preferred embodiment of the present invention.

The eject handle 112 is preferably used to cam the connector module from a mother board. Accordingly, a cam bar is preferably interconnected with the eject handle to effect the camming action. FIG. 6A shows a side view of a cross section of a cam bar 124 according to a preferred embodiment of the present invention. The cam bar 124 preferably has two camming projections 130 that extend from the side of the cam bar 124. A top view of a cross section of the cam bar 124 is shown in FIG. 6B in which the camming projections 130 can be seen to protrude from the cam bar 124. As shown in FIG. 6A, the camming projections 130 have a triangular section to enable the camming motion. However, it should be understood that the shape of the camming projection 130 may be modified in numerous ways and still permit camming as described below. Moreover, although two camming projections 130 are shown in FIGS. 6A and 6B, it should be further understood that virtually any number of camming projections 130 could be provided by a suitable cam bar 124.

The cam bar 124 also provides drive slots 126 through which the driving rods 121 and 122 can be inserted to interface the eject handle 112 with the cam bar 124. As shown in FIG. 6B, the outer drive slot 126 preferably provides an inner drive slot 127 in which the driving rod 122 is received.

Figure 7:
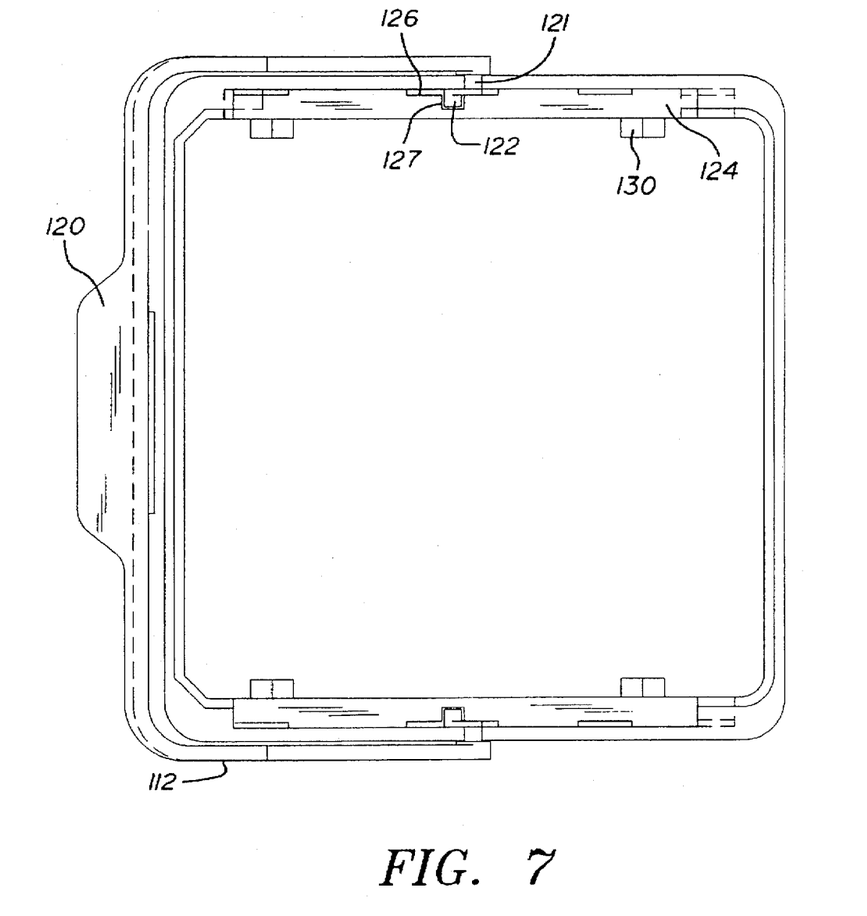
FIG. 7 shows a top cross sectional view of an eject handle coupled to two cam bars according to a preferred embodiment of the present invention.

A top view of the eject handle 112 assembled with two cam bars 124 is shown in FIG. 7. The driving rods 121 and 122 are inserted into the outer drive slot 126 of respective cam bars 124 as shown in the figure. As is described below the eject handle 112 is shown in a lock-in position such that only driving rod 122 is positioned in the inner drive slot 127.

Figure 8:
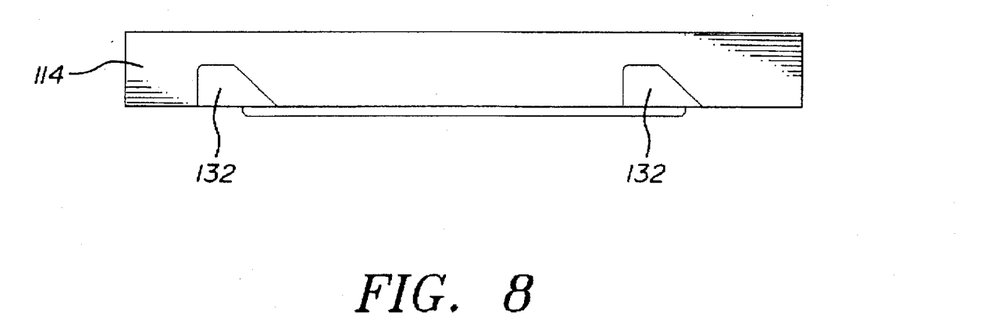
FIG. 8 shows a side view of a portion of the frame according to the invention where a cam bar can be interfaced with the frame.

FIG. 8 is a side view of an edge 114 of the module frame 100 (FIG. 4) where the cam bar 124 can be interfaced to the module frame 100. Two of the frame edges 114 are preferably provided with cam surface openings 132 as shown in the figure. Thus, each cam bar 124 is mechanically interfaced with the module frame automatically when the cam surface openings 132 enclose the camming projections 130 of the cam bar 124 as the circuit board connector module is connected to the mother board through the receptacle frame.

Figure 9A:
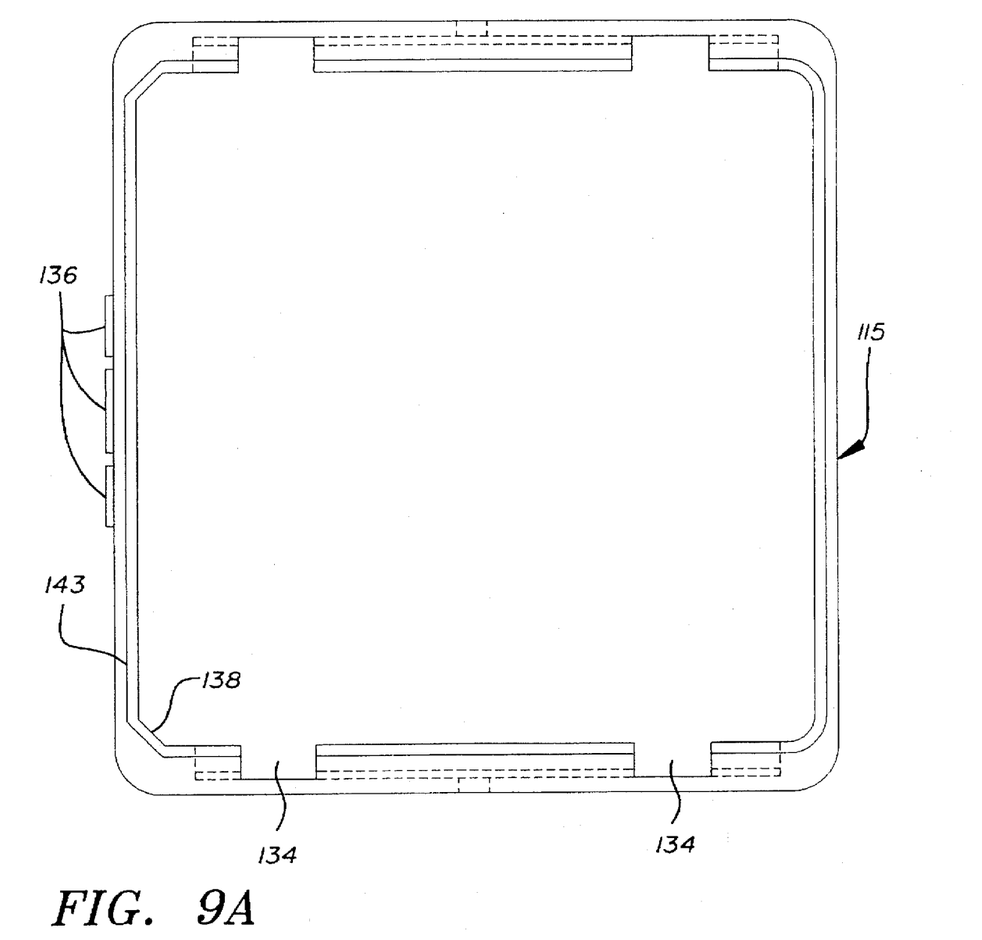
FIG. 9A shows a top view of a receptacle frame according to a preferred embodiment of the invention.
Figure 9B:
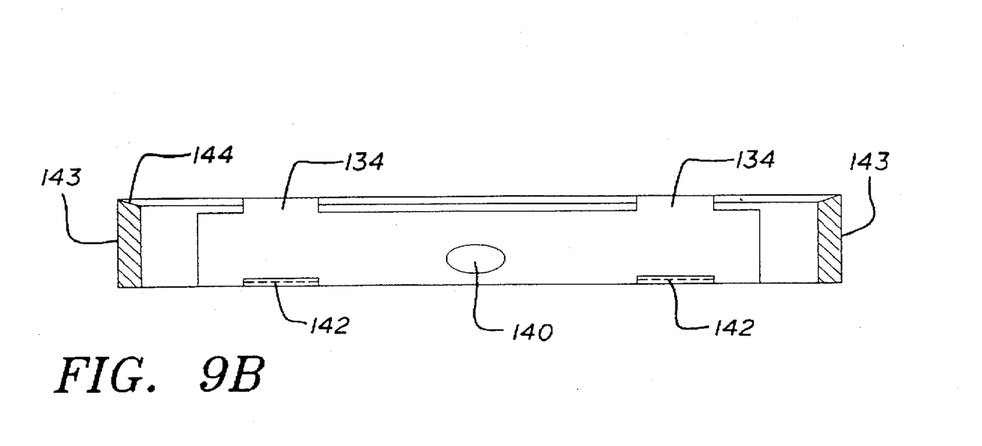
FIG. 9B shows a side view of a cross section of the receptacle frame according to a preferred embodiment of the invention.

A top view of the receptacle frame 115 is shown in FIG. 9A. As shown in the figure the receptacle frame 115 preferably provides slots 134 in which projections 128 of the cam bar 124 can be inserted. In a side view of the cross section of the receptacle frame, which is shown in FIG. 9B, ridges 142 serve to contain the cam bar inside the receptacle frame 115. As shown in FIG. 7, the driving rods 121 and 122 of the eject handle 112 can be inserted through the opening 140 of the receptacle frame by spreading handle 112 and inserting the rods through the opening 140 and into the inner drive slot 127. Therefore, the frame is preferably made of a flexible material such as nylon. In order to insert the driving rods 121 and 122 into the inner drive slot, the cam bar can be displaced laterally from its original insertion position. When the cam bar is displaced laterally and the driving rods are inserted into the inner drive slot, the projections 128 of the cam bar are no longer aligned with slots 134 in the receptacle frame, thereby locking the cam bar into the receptacle frame. The eject handle 112 is operatively interfaced with the cam bars 124 and the receptacle frame 115 as shown in FIG. 7.

The receptacle frame 115 is preferably mounted to the mother board via pins, screws, glue or any other suitable means. The size and shape of the receptacle frame 115 is such that the assembled connector module may be connected to the mother board by inserting the connector module into the receptacle frame. Thus, only the connector module 101 requires alignment with the receptacle frame 115 to connect an expansion board assembled according to the invention to a mother board. It should be understood that the use of the receptacle frame further simplifies the process of connecting the connector module to the mother board by eliminating the need to align the apertures in the module frame with each respective mating connector on the mother board.

Figure 10:
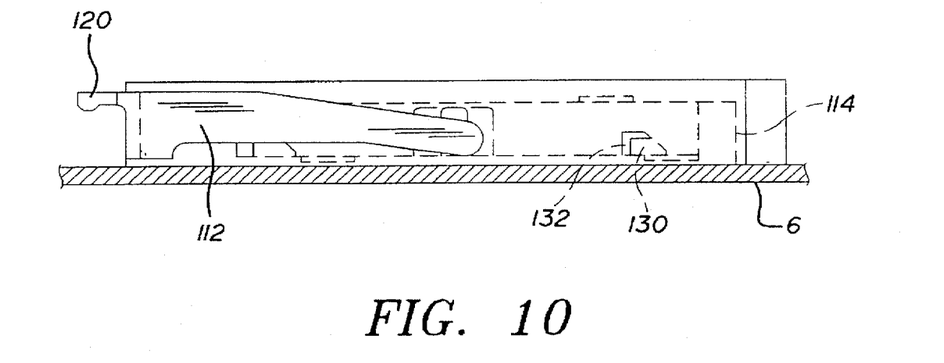
FIG. 10 shows a cross sectional side view of the shielded circuit board connector module mated with a mother board.

Two of the corners 138 (FIG. 9A) of the receptacle frame 115 preferably provide matching or mating corners for a module frame 100 having the polarity indication described in connection with FIG. 3. For example, in the preferred embodiment shown in FIG. 3, two of the corners 110 are clipped. Accordingly, matching corners 138 are provided by the receptacle frame 115 shown in FIG. 9 so that when the connector module 101 is inserted into the receptacle frame 115 it only "fits" one way as shown in FIG. 10, thereby ensuring that the circuit boards mate with the correct polarity. However, it should be understood that the polarity indicators shown in FIGS. 3 and 4 are for illustrative purposes only and, therefore, the invention should not be limited to the clipped corners shown therein. For instance, a single side, either the module frame or both the module and receptacle frames, could provide a projection or indentation to indicate the polarity of the electronics in the connector module.

In a more preferred embodiment the receptacle frame 115 provides a beveled edge 144 shown in FIG. 9B. The beveled edge 144 further simplifies the process of inserting the connector module into the receptacle frame 115 by providing additional lead-in guidance.

In the preferred embodiment shown in FIG. 4, the eject handle 112 is attached to the receptacle frame 115 and the cam bars are secured to the inside frame walls 143 (FIGS. 9A and 9B) so that the cam bars cannot be seen in FIG. 4. When the module 101 is connected with a mother board 6, it is preferable to place the eject handle 112 in a position referred to herein as the lock-in position. This position of the eject handle 112 is shown in FIG. 10 in which a side cross sectional view of the connector module 101 is shown mating with a mother board 6.

Figure 11:
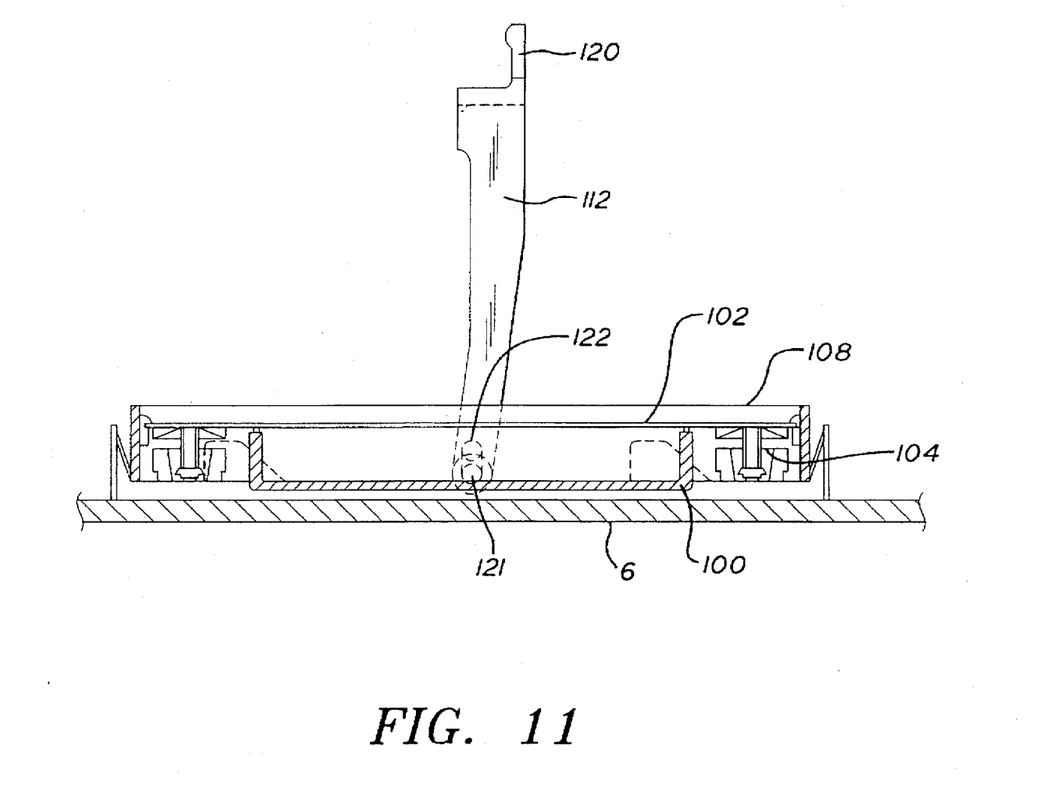
FIG. 11 shows a cross sectional side view of the shielded circuit board connector module extracted from a mother board.

To extract the connector module 101 from the mother board 6, the handle projection 120 is lifted to pivot the eject handle 112 about the drive slots 126 (FIGS. 6A and 6B). As the eject handle 112 pivots, driving rods 121 and 122 align within extended drive slot 127 (FIG. 6). As the driving rods 121 and 122 align within extended drive slot 127 of a respective cam bar 124, the cam bar 124 is forced to slidably move so that its camming projections 130 exert a sufficient force against the cam surface openings 132 of the module frame 100 in which the camming projections 130 are located. The resulting camming motion causes the connector module to be extracted from the mother board. FIG. 11 shows a cross sectional side view of the connector module 101 extracted from the mother board 6 after lifting the eject handle 112. It should be understood that the use of the eject handle and cam bar combination according to the present invention provides a simple means for effectively extracting a connector module from a mother board without "wiggling" the printed circuit board to unmate it from the mother board, thereby avoiding potential damage to connectors 104.

In the preferred embodiment in which a receptacle frame is mounted to the mother board, one or more frame projections 136 are provided as shown in FIG. 9A. Similarly, the eject handle as shown in FIG. 5A provides a locking projection 119 such that when the eject handle 112 is pulled down in alignment with the receptacle frame 115, the locking projection 119 is pulled over the frame projections 136 to lock the eject handle 112 in place. It should be understood that either the frame projections 136 or the locking projections 119 or both may be rounded or beveled to permit the eject handle 112 to be forcibly unlocked by lifting the eject handle 112.

In a more preferable embodiment, a thermal gap filling material is inserted to fill any gaps between the electronics on the PCB and the frame and any gaps that form between the outer frame surface and the mother board. Such materials may include, for instance, a commercially available thermally conductive elastomer with an aluminum oxide filled silicone layer. Thermally conductive adhesive tape may also be used to fill in the above-noted gaps. Such tape is also commercially available. These thermal gap filling materials and tapes provide a thermal path many times more conductive than air. Thus, the thermal energy generated by the ICs can be dissipated into the frame and onto the mother board which is generally much cooler.

While the invention has been described and illustrated with reference to specific embodiments, those skilled in the art will recognize that modification and variations may be made without departing from the principles of the invention as described herein above and set forth in the following claims.

What is claimed:

1. A shielded module for a circuit board having a front surface and a rear surface, said circuit board having electronics and at least one connector extending from said front surface, said circuit board adapted to be detachably connected to another circuit board, comprising:
   a conductive frame capable of being mechanically coupled to said front surface of said circuit board to substantially enclose said electronics between said frame and said circuit board;
   a conductive cover capable of being mechanically coupled to one of said rear surface and said conductive frame to substantially cover said rear surface, said conductive frame together with said conductive cover being adapted to shield said entire circuit board from electromagnetic interference; and
   a thermal transfer medium disposed between said conductive frame and said electronics for coupling thermal energy generated by said electronics to said conductive frame.

2. A shielded module for a circuit board having a front surface and a rear surface, said circuit board having electronics and at least one connector extending from said front surface, said circuit board adapted to be detachably connected to another circuit board, comprising:
   a conductive frame capable of being mechanically coupled to said front surface of said circuit board to substantially enclose said electronics between said frame and said circuit board;
   a conductive cover capable of being mechanically coupled to one of said rear surface and said conductive frame to substantially cover said rear surface, said conductive frame together with said conductive cover being adapted to shield said entire circuit board from electromagnetic interference; and
   a camming means operatively interfaced with said conductive frame for camming said circuit board from said other circuit board,
   wherein said circuit board is capable of being connected to another circuit board having at least one surface so that said surfaces of said circuit boards are parallel.

3. A shielded module for a circuit board having a front surface and a rear surface, said circuit board having electronics and at least one connector extending from said front surface, said circuit board adapted to be detachably connected to another circuit board, comprising:

a conductive frame capable of being mechanically coupled to said front surface of said circuit board to substantially enclose said electronics between said frame and said circuit board;

a conductive cover capable of being mechanically coupled to one of said rear surface and said conductive frame to substantially cover said rear surface, said conductive frame together with said conductive cover being adapted to shield said entire circuit board from electromagnetic interference;

a receptacle frame being attached to said other circuit board so that said circuit boards are connected to each other by inserting said shielded module as assembled into said receptacle frame; and a camming means operatively interfaced with said receptacle frame for camming said circuit board from said other circuit board, wherein said circuit board is capable of being connected to another circuit board having at least one surface so that said surfaces of said circuit boards are parallel.

4. The shielded module of claim 3, wherein said camming means comprises:

an eject handle pivotally connected to at least two edges of said receptacle frame and having a lock-in position in which said eject handle is aligned with said edges; and a cam bar mechanically interfaced with said conductive frame, said receptacle frame and said eject handle so that said cam bar is capable of camming said shielded module from said other circuit board when said eject handle is pivoted from said lock-in position.

5. A circuit board connector module, comprising:

a circuit board having at least one connector attached to a front surface of said circuit board, said circuit board adapted to be detachably connected to another circuit board;

a conductive frame mechanically coupled to said circuit board so that said frame substantially shields said front surface of said circuit board while exposing each said connector;

a conductive cover mechanically attached to one of a rear surface of said circuit board and said conductive frame to substantially shield said entire rear surface, said conductive frame cooperating with said conductive cover to shield said entire circuit board from electromagnetic interference; and a camming means interfaced with said conductive frame for camming said circuit board connector module from said other circuit board, wherein said circuit board connector module is capable of being connected to another circuit board having at least one surface so that said surfaces of said circuit boards are parallel.

6. The circuit board connector module of claim 5, wherein said camming means comprises:

an eject handle pivotally connected to at least two edges of said conductive frame and having a lock-in position in which said eject handle is aligned with said edges; and a cam bar mechanically interfaced with said conductive frame and said eject handle so that said cam bar is capable of camming said circuit board connector module from said other circuit board when said eject handle is pivoted from said lock-in position.

7. A circuit board connector module, comprising:

a circuit board having at least one connector attached to a front surface of said circuit board, said circuit board adapted to be detachably connected to another circuit board;

a conductive frame mechanically coupled to said circuit board so that said frame substantially shields said front surface of said circuit board while exposing each said connector;

a conductive cover mechanically attached to one of a rear surface of said circuit board and said conductive frame to substantially shield said entire rear surface, said conductive frame cooperating with said conductive cover to shield said entire circuit board from electromagnetic interference; and a receptacle frame attached to said other circuit board so that said circuit boards are connected to each other by inserting said circuit board connector module into said receptacle frame, wherein said circuit board connector module is capable of being connected to another circuit board having at least one surface so that said surfaces of said circuit boards are parallel, and wherein said conductive frame provides an indication of a polarity of said circuit board when said circuit board is mechanically coupled thereto and said receptacle frame provides a matching indication so that when said receptacle frame is attached to said other circuit board said circuit board connector module is only connected to said other circuit board having the correct polarity.

8. A circuit board connector module, comprising:

a circuit board having at least one connector attached to a front surface of said circuit board, said circuit board adapted to be detachably connected to another circuit board;

a conductive frame mechanically coupled to said circuit board so that said frame substantially shields said front surface of said circuit board while exposing each said connector;

a conductive cover mechanically attached to one of a rear surface of said circuit board and said conductive frame to substantially shield said entire rear surface, said conductive frame cooperating with said conductive cover to shield said entire circuit board from electromagnetic interference;

a receptacle frame attached to said other circuit board so that said circuit boards are connected to each other by inserting said circuit board connector module into said receptacle frame; and a camming means attached to said receptacle frame and interfaced with said conductive frame for camming said circuit board connector module from said other circuit board, wherein said circuit board connector module is capable of being connected to another circuit board having at least one surface so that said surfaces of said circuit boards are parallel.

9. The circuit board connector of claim 8, wherein camming means comprises:

an eject handle pivotally connected to at least two edges of said receptacle frame and having a lock-in position in which said eject handle is aligned with said edges; and a cam bar mechanically interfaced with said receptacle frame, said conductive frame and said eject handle so that said cam bar is capable of camming said circuit board connector module from said other circuit board when said eject handle is pivoted from said lock-in position.

10. A circuit board connector module, comprising:

a circuit board having at least one connector attached to a front surface of said circuit board, said circuit board adapted to be detachably connected to another circuit board;

a conductive frame mechanically coupled to said circuit board so that said frame substantially shields said front surface of said circuit board while exposing each said connector;

a conductive cover mechanically attached to one of a rear surface of said circuit board and said conductive frame to substantially shield said entire rear surface, said conductive frame cooperating with said conductive cover to shield said entire circuit board from electromagnetic interference; and a thermal transfer medium disposed between said conductive frame and said circuit board.

11. A method of assembling a shielded circuit board connector module, comprising the steps of:

attaching a conductive frame to a front surface of a circuit board, said circuit board adapted to be detachably connected to another circuit board;

covering a rear surface of said circuit board with a conductive cover so that said conductive frame and said conductive cover cooperate to substantially shield said entire circuit board from electromagnetic interference; wherein said circuit board has at least one connector extending from the front surface and said conductive frame has one corresponding aperture for each connector extending from said front surface so that said connectors are not shielded by said conductive frame; and wherein said conductive frame has an eject means coupled thereto so that said eject means can be pivotally rotated about an axis of said conductive frame;

connecting said shielded circuit board connector module to a mother board; and securing said eject means in a lock-in position.

12. The method of claim 11, further comprising the step of:

pivotally rotating said eject means from said locking position to release said connection.

13. A method of assembling a shielded circuit board connector module, comprising the steps of:

attaching a conductive frame to a front surface of a circuit board, said circuit board adapted to be detachably connected to another circuit board;

covering a rear surface of said circuit board with a conductive cover so that said conductive frame and said conductive cover cooperate to substantially shield said entire circuit board from electromagnetic interference, wherein said circuit board has at least one connector extending from the front surface and said conductive frame has one corresponding aperture for each connector extending from said front surface so that said connectors are not shielded by said conductive frame;

attaching a receptacle frame to a mother board; and connecting said circuit board connector module to said mother board by inserting said shielded circuit board connector module into said receptacle frame.

14. The method of claim 13, wherein said receptacle frame has a camming means coupled thereto, said camming means also being operatively interfaced with said conductive frame, the method further comprising the step of:

actuating said camming means to operatively lock-in said connection between said circuit boards and to extract said circuit board connector module from said connection.

* * * * *